(12) United States Patent
Yang et al.

(10) Patent No.: US 8,796,854 B2
(45) Date of Patent: Aug. 5, 2014

(54) HYBRID INTERCONNECT STRUCTURE FOR PERFORMANCE IMPROVEMENT AND RELIABILITY ENHANCEMENT

(71) Applicant: International Business Machines Corporation, Armonk, NY (US)

(72) Inventors: Chih-Chao Yang, Glenmont, NY (US); Thomas M. Shaw, Peekskill, NY (US); Keith Kwong Hon Wong, Wappingers Falls, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/838,956

(22) Filed: Mar. 15, 2013

(65) Prior Publication Data

US 2013/0221529 A1   Aug. 29, 2013

Related U.S. Application Data

(60) Continuation of application No. 13/174,841, filed on Jul. 1, 2011, now Pat. No. 8,456,006, which is a division of application No. 11/625,576, filed on Jan. 22, 2007, now Pat. No. 7,973,409.

(51) Int. Cl.
*H01L 21/00* (2006.01)

(52) U.S. Cl.
USPC ............................ 257/751; 257/750; 257/758

(58) Field of Classification Search
USPC ........................................ 257/750–751, 758
See application file for complete search history.

(56) References Cited

U.S. PATENT DOCUMENTS

| | | | |
|---|---|---|---|
| 5,759,913 A | 6/1998 | Fulford et al. | |
| 5,949,143 A | 9/1999 | Bang | |
| 6,104,077 A | 8/2000 | Gardner et al. | |
| 6,159,845 A | 12/2000 | Yew et al. | |
| 6,208,015 B1 | 3/2001 | Bandyopadhyay et al. | |
| 6,211,057 B1 | 4/2001 | Lin et al. | |
| 6,217,418 B1 | 4/2001 | Lukanc et al. | |
| 6,329,279 B1 | 12/2001 | Lee | |
| 6,399,476 B2 | 6/2002 | Kim et al. | |
| 6,423,629 B1 | 7/2002 | Ahn et al. | |
| 6,433,436 B1 | 8/2002 | Feild et al. | |
| 6,440,839 B1 | 8/2002 | Partovi et al. | |
| 6,445,072 B1 | 9/2002 | Subramanian et al. | |
| 6,501,180 B1 | 12/2002 | Kitch | |
| 6,524,948 B2 | 2/2003 | Tamaoka et al. | |

(Continued)

OTHER PUBLICATIONS

International Search Report dated May 9, 2008.

*Primary Examiner* — Laura Menz

(74) *Attorney, Agent, or Firm* — Scully, Scott, Murphy & Presser, P.C.; Louis J. Percello

(57) ABSTRACT

A hybrid interconnect structure (of the single or dual damascene type) is provided in which a dense (i.e., non-porous) dielectric spacer is present on the sidewalls of a dielectric material. More specifically, the structure includes a dielectric material having a conductive material embedded within at least one opening in the dielectric material, wherein the conductive material is laterally spaced apart from the dielectric material by a diffusion barrier, a dense dielectric spacer and, optionally, an air gap. The presence of the dense dielectric spacer results in a hybrid interconnect structure that has improved reliability and performance. Moreover, the hybrid interconnect structure provides for better process control which leads to the potential for high volume manufacturing.

19 Claims, 10 Drawing Sheets

(56) References Cited

U.S. PATENT DOCUMENTS

| | | |
|---|---|---|
| 6,635,967 B2 | 10/2003 | Chang et al. |
| 6,815,329 B2 | 11/2004 | Babich et al. |
| 6,861,332 B2 | 3/2005 | Park et al. |
| 6,867,125 B2 | 3/2005 | Kloster et al. |
| 7,033,926 B2 | 4/2006 | Schindler et al. |
| 7,071,091 B2 | 7/2006 | Clarke et al. |
| 7,071,532 B2 * | 7/2006 | Geffken et al. ............... 257/522 |
| 7,256,127 B2 | 8/2007 | Gallagher et al. |
| 7,309,649 B2 | 12/2007 | Colburn et al. |
| 7,361,991 B2 | 4/2008 | Saenger et al. |
| 7,393,776 B2 | 7/2008 | Colburn et al. |
| 7,485,567 B2 | 2/2009 | Clevenger et al. |
| 7,790,542 B2 | 9/2010 | Dyer et al. |
| 7,807,563 B2 | 10/2010 | Gabric et al. |
| 7,811,924 B2 | 10/2010 | Cui et al. |
| 7,973,409 B2 | 7/2011 | Yang et al. |
| 2001/0045608 A1 | 11/2001 | Tseng et al. |
| 2003/0176055 A1 | 9/2003 | Wu |
| 2006/0151887 A1 | 7/2006 | Oh et al. |
| 2006/0264027 A1 | 11/2006 | Su et al. |
| 2007/0001306 A1 | 1/2007 | Su et al. |
| 2007/0246831 A1 | 10/2007 | Gabric et al. |
| 2008/0185722 A1 | 8/2008 | Liu et al. |
| 2009/0072409 A1 | 3/2009 | Nitta et al. |
| 2009/0075470 A1 | 3/2009 | Nitta et al. |
| 2009/0294898 A1 | 12/2009 | Feustel et al. |
| 2009/0315117 A1 | 12/2009 | Dyer et al. |
| 2010/0133648 A1 | 6/2010 | Seidel et al. |
| 2011/0260323 A1 | 10/2011 | Yang et al. |

\* cited by examiner

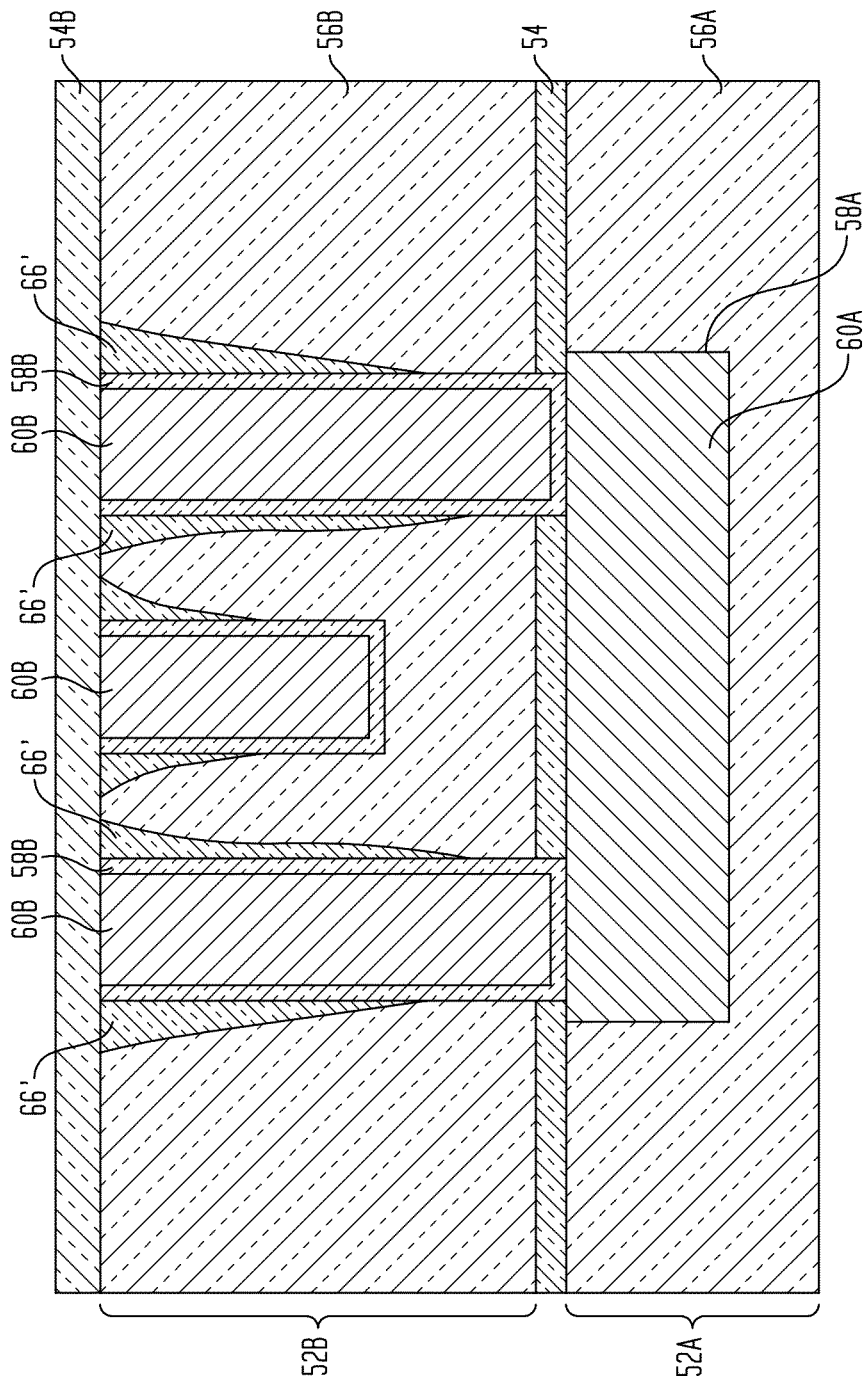

US 8,796,854 B2

HYBRID INTERCONNECT STRUCTURE FOR PERFORMANCE IMPROVEMENT AND RELIABILITY ENHANCEMENT

CROSS REFERENCE TO RELATED APPLICATION

This application is a continuation of U.S. patent application Ser. No. 13/174,841, filed Jul. 1, 2011 which is a divisional of U.S. patent application Ser. No. 11/625,576, filed Jan. 22, 2007, now U.S. Pat. No. 7,973,409 the entire content and disclosure of each is incorporated herein by reference.

FIELD OF THE INVENTION

The present invention relates to a semiconductor structure and a method of fabricating the same. More particularly, the present invention relates to a hybrid interconnect structure that exhibits improved performance as well as enhanced reliability.

BACKGROUND OF THE INVENTION

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

That is, in order to reduce the interconnect portion of circuit delay, conventional dielectric materials having a dielectric constant of about 4.0 or greater such as, for example, silicon dioxide, have been replaced with dense lower-k dielectric materials having a dielectric constant of less than 4.0, preferably less than 3.5. It is noted that all dielectric constants mentioned throughout this application are relative to vacuum. For further performance improvement, more dielectric capacitance reduction is required for advanced devices.

Capacitance improvements can be made by replacing the dense low-k dielectric materials with porous low-k dielectric materials. Despite the improvement in capacitance, porous low-k dielectric materials have relatively weak mechanical properties as compared to dense dielectrics. Additionally, it is a significant challenge for current interconnects processing to integrate porous low-k dielectric materials with other module processes.

For example, the conventional chemical mechanical polishing (CMP) process has difficulty in planarizing a low mechanical-module porous dielectric, and the conventional physical vapor deposition (PVD) diffusion barrier deposition technology cannot offer reasonable coverage on the surface of the porous low-k dielectric material. That is, the conventional PVD process provides a discontinuous PVD liner on the exposed surfaces of the porous low-k dielectric material. It is noted that the presence of a discontinuous PVD liner around the conductive feature embedded in a porous low k dielectric material is a sever circuit reliability concern.

Referring back to dense low-k dielectric materials, the applicants have observed that an undercut profile, such as shown, in FIG. 1A, exists because of the etching rate difference between the dense low-k dielectric material and the oxide-containing hard mask material. A similar result may exist with some porous low-dielectric materials as well. Specifically, FIG. 1A shows a partially formed prior art interconnect structure 10 which includes a lower interconnect level 12A and an upper interconnect level 12B which are separated by a dielectric capping layer 20. The lower interconnect level 12A includes a first dielectric material 14A having at least one conductive feature represented by conductive material 18A embedded therein. A diffusion barrier 16A separates the conductive material 18A from the first dielectric material 14A. Atop the dielectric capping layer 20, is the upper interconnect level 12B which, at this stage of the prior art process, includes a patterned dense low-k dielectric material 14B and a patterned oxide-containing hard mask 22 located on a surface of the low-k dielectric material 14B. The undercut region is labeled as 24 in FIG. 1A.

This undercut profile results in poor conductor fill property in the final interconnect structure and leaves voids between the diffusion barrier and the interconnect conductive material. This is clearly seen in FIGS. 1B (actual cross sectional photograph of a prior art interconnect structure) and 1C (actual top down view). The term ILD denotes the second dielectric material 14B mentioned above, barrier represents a second diffusion barrier that is formed in the opening of the patterned ILD, Cu represents the conductive material used in filling the openings. Reliability related issues may be caused by having the voids present inside the interconnect structure.

In view of the above, there is a need for providing a new and improved interconnect structure which overcomes all of the drawbacks mentioned above. That is, there is a need for providing a new and improved interconnect structure that has improved performance as well as enhanced reliability without changing the existing materials or the process flow significantly.

SUMMARY OF THE INVENTION

The present invention provides an interconnect structure (of the single or dual damascene type) and a method of forming the same, in which a dense (i.e., non-porous) dielectric spacer is present on the sidewalls of a dielectric material. The presence of the dense dielectric spacer results in a hybrid interconnect structure that has improved reliability and performance as compared with existing prior art interconnect structures which do not include such dense dielectric spacers. Moreover, the inventive hybrid interconnect structure provides for better process control which leads to the potential for high volume manufacturing.

It is noted that by 'improved reliability' it is meant that the inventive hybrid interconnect structure has improved barrier coverage and improved conductor/barrier adhesion. The improved barrier coverage means less leakage concerns within the inventive interconnect structure, while improved adhesion means less electromigration within the inventive interconnect structure.

The present invention provides a hybrid interconnect structure that contains a dense dielectric spacer located on patterned sidewalls of an interconnect dielectric material which avoids maintaining an undercut region within the final interconnect structure. The present invention also provides, in some embodiments, an embedded air gap within the interconnect structure which helps to reduce the overall interconnect capacitance and to enhance the circuit performance.

In one embodiment, the present invention provides a hybrid interconnect structure that comprises:

a dielectric material having a conductive material embedded within at least one opening in said dielectric material, wherein said conductive material is laterally spaced apart from said dielectric material by a diffusion barrier and a dense dielectric spacer, said diffusion barrier is in contact with said conductive material.

In another embodiment, the present invention provides a hybrid interconnect structure that comprises:

a dielectric material having a conductive material embedded within at least one opening in said dielectric material, wherein said conductive material is laterally spaced apart from said dielectric material by a diffusion barrier, a dense dielectric spacer and an air gap, said diffusion barrier is in contact with said conductive material.

In yet another embodiment of the present invention, an interconnect structure is provided that includes:

a lower interconnect level comprising a first dielectric material having a first conductive material embedded therein; and an upper interconnect level comprising a second dielectric material having at least one opening that is in contact with said first conductive material of the lower interconnect level, wherein said second dielectric material has a second conductive material embedded within said at least one opening that is laterally spaced apart from said second dielectric material by a diffusion barrier and a dense dielectric spacer, said diffusion barrier is in contact with at least said second conductive material.

In some embodiments, an optional air gap may also be present in the upper interconnect level.

In any of the embodiments mentioned above, the dielectric material includes any dielectric level of an interconnect structure. The dielectric material may be dense or porous, with porous being highly preferred. The dielectric material employed in any of the embodiments has a dielectric constant of about 4.0 or less. Examples of some dielectric materials that can be employed include $SiO_2$, silsesquioxanes, C doped oxides (i.e., organosilicates) that include atoms of Si, C, O and H, SiC(N,H), thermosetting polyarylene ethers, or multilayers thereof. Preferably, a dielectric material having a dielectric constant of less than silicon dioxide is employed.

The dielectric spacer employed in the present invention comprises any dielectric material whose composition is typically, but not necessarily always, different from that of the dielectric material including the embedded conductive material. Examples of dielectric spacers that can be used in the present invention include, but are not limited to: $SiO_2$, $Si_3N_4$, SiC, silsesquioxanes, C doped oxides (i.e., organosilicates) that include atoms of Si, C, O and H, SiC(N,H) or thermosetting polyarylene ethers. Multilayered dense dielectric spacers are also within the scope of the present invention.

In addition to the hybrid interconnect structure mentioned above, the present invention also relates to a method of fabricating such a hybrid interconnect structure. The inventive method is compatible within current interconnect processing and, as such, no significant cost increase is associated with the fabrication thereof. Additionally, the inventive method (as well as the interconnect structure) does not put any limitations on the possible choices for the ILD material which means that the inventive method (as well as interconnect structure) provides for better technology extendibility.

In general terms, the method of the present invention comprises:

forming at least one opening in a dielectric material utilizing a patterned hard mask located on a surface of said dielectric material as a mask, wherein an undercut is present beneath said patterned hard mask;

forming a dense dielectric spacer in said at least one opening on exposed sidewalls of said dielectric material;

forming a diffusion barrier within said at least one opening on at least said dense dielectric spacer; and forming a conductive material within said at least one opening on said diffusion barrier.

In some embodiments of the inventive method, an air gap remains between the dense dielectric spacer and the dielectric material. The air gap is typically located near the undercut region mentioned above.

BRIEF DESCRIPTION OF THE DRAWINGS

FIGS. 2A-2B are pictorial representations (through cross sectional views) illustrating the inventive hybrid interconnect structure in accordance with a first embodiment and a second embodiment of the present invention.

DETAILED DESCRIPTION OF THE INVENTION

The present invention, which provides a hybrid interconnect structure including a dense dielectric spacer on sidewalls of a patterned dielectric material as well as a method of fabricating the same, will now be described in greater detail by referring to the following discussion and drawings that accompany the present application. The drawings of the present invention, which are referred to in the present application, are provided for illustrative purposes and, as such, they are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Generally, the present invention provides a hybrid interconnect structure (see, for example, FIGS. 2A-2B) which includes a dielectric material 56B having a conductive material 60B embedded within at least one opening in the dielectric material 56B, wherein the conductive material 60B is laterally spaced apart from the dielectric material 56B by a diffusion barrier 58B, a dense dielectric spacer 66' and, optionally, an air gap 68.

Figure 1A:
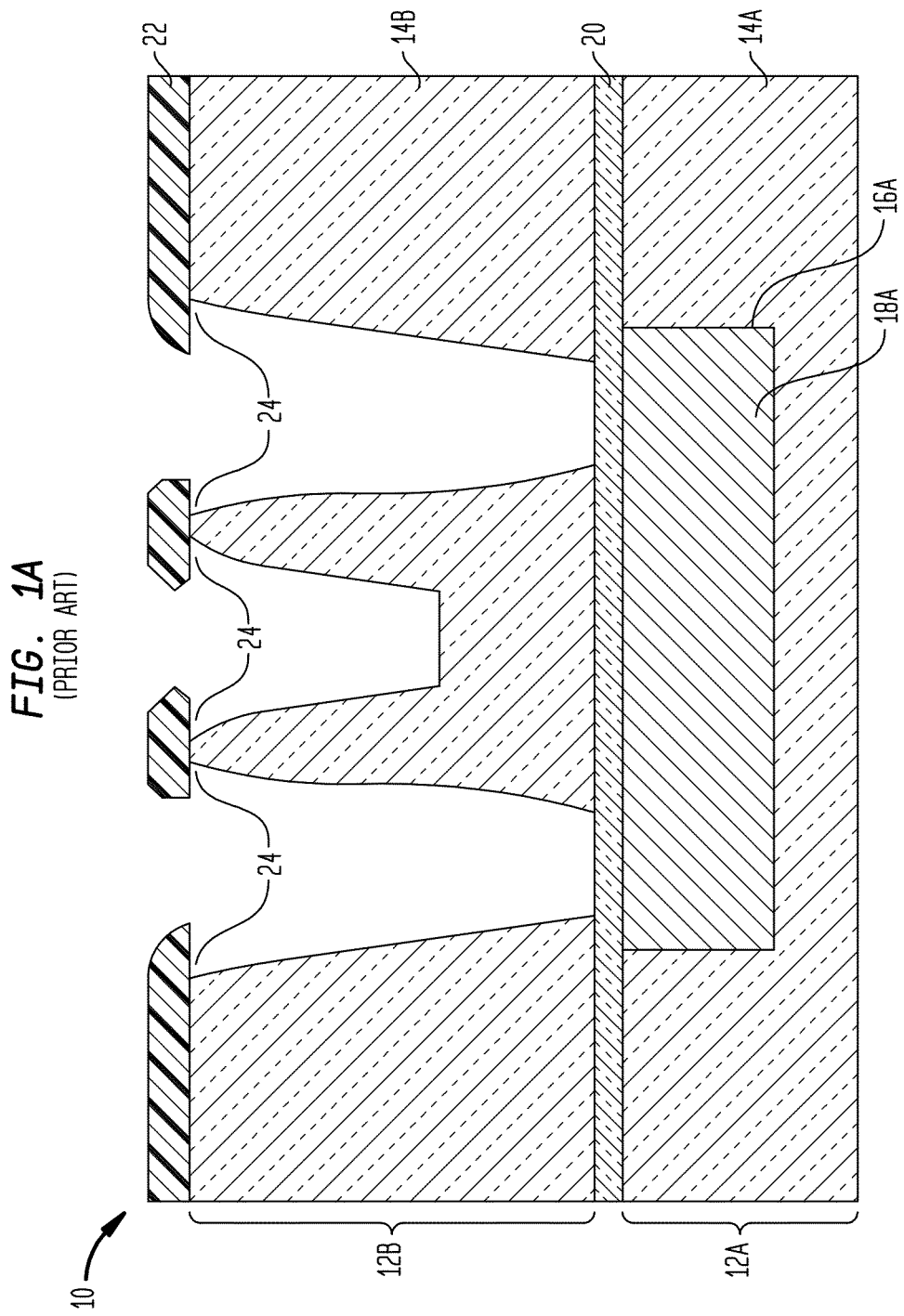
FIG. 1A is a pictorial representation (through a cross sectional view) of a partially formed prior art interconnect structure which includes undercuts between an oxide-containing hard mask and a low-k dielectric material.
Figure 1B:
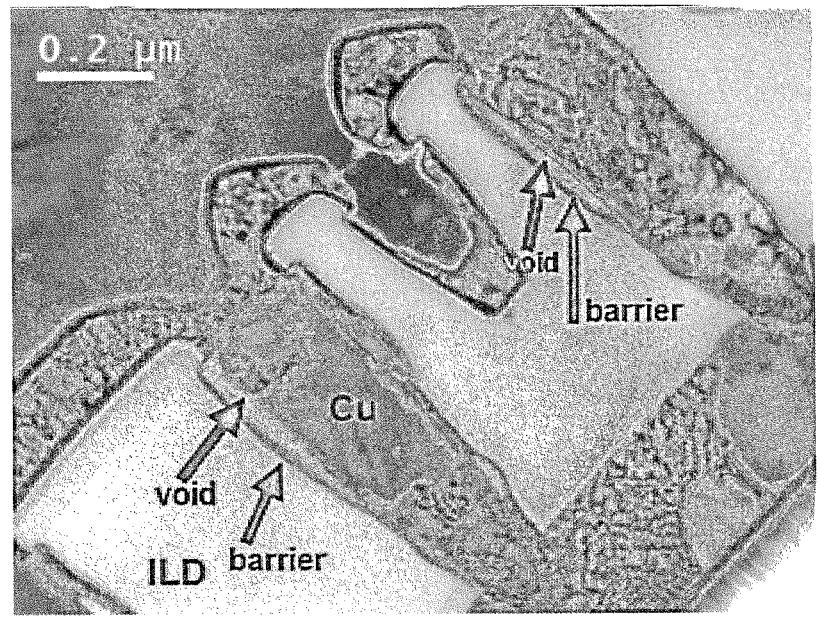
FIG. 1B is a cross sectional photograph of an actual prior art interconnect structure which includes voids created from the undercuts shown in FIG. 1A.
Figure 1C:
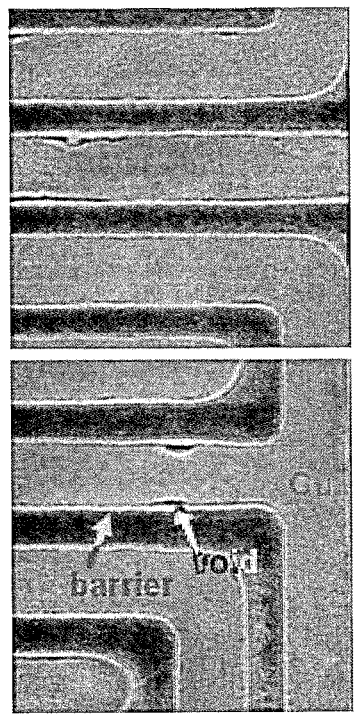
FIG. 1C is a top-down photograph of the prior art interconnect structure whose cross sectional view is shown in FIG. 1B.
Figure 2A:
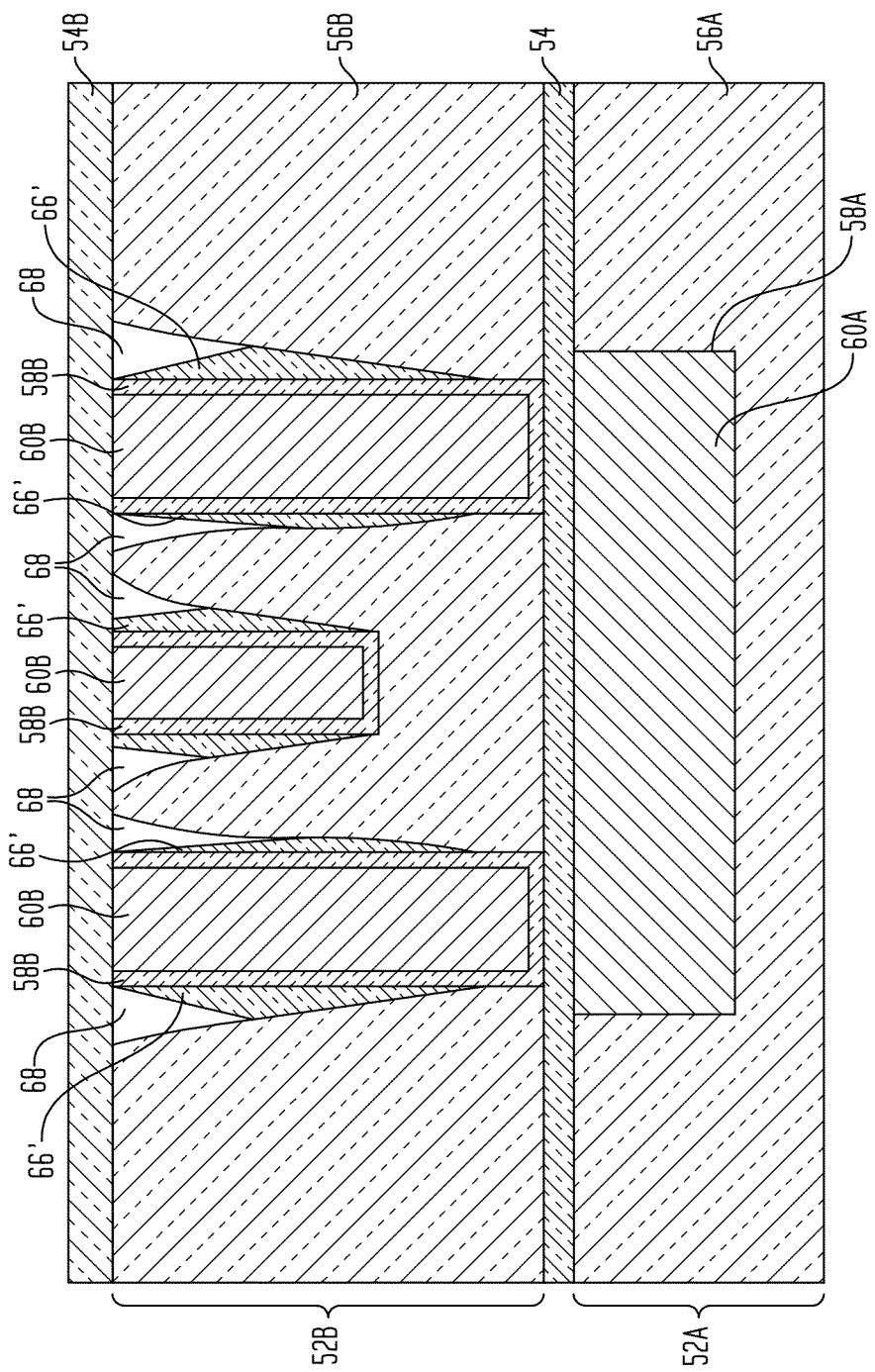

More particularly, FIGS. 2A and 2B illustrates various embodiments of the present invention. FIG. 2A is an embodiment including an air gap, while FIG. 2B is an embodiment which does not include an air gap. Both embodiments shown include the following elements: a lower interconnect level 52A comprising a first dielectric material 56A having a first conductive material 60A embedded therein. An upper interconnect level 52B is also present in the two illustrated embodiments. Specifically, the upper interconnect level 52B includes a second dielectric material 56B having at least one opening that is in contact with the first conductive material 60A of the lower interconnect level 52A. The second dielectric material 56B has a second conductive material 60B embedded within said at least one opening and the conductive material 60B is laterally spaced apart from the second dielectric material 56B by a diffusion barrier 58B, a dense dielectric spacer 66' and, optionally, an air gap 68. If present, the air gap 68 is located in an undercut region that was created beneath the hard mask that was used in patterning the second dielectric material 56B.

The other elements illustrated and referenced in FIGS. 2A-2B will be described in detail in the process flow that follows.

Reference is now made to FIGS. 3A-3F which illustrate the basic processing steps that are employed in the present invention for fabricating the inventive structure shown in FIG. 2A. Although the basic processing steps can be used in forming the inventive interconnect structure shown in FIG. 2A, the same can also be used in forming the inventive interconnect structure shown in FIG. 2B except that during the formation of the dense dielectric liner 66 a better conformal deposition technique is employed to completely fill in the undercut feature 64. An alternative method to create more volume of air gap 68 is to exaggerate the undercut feature 64 intentionally post/during the etching process.

Figure 3A:
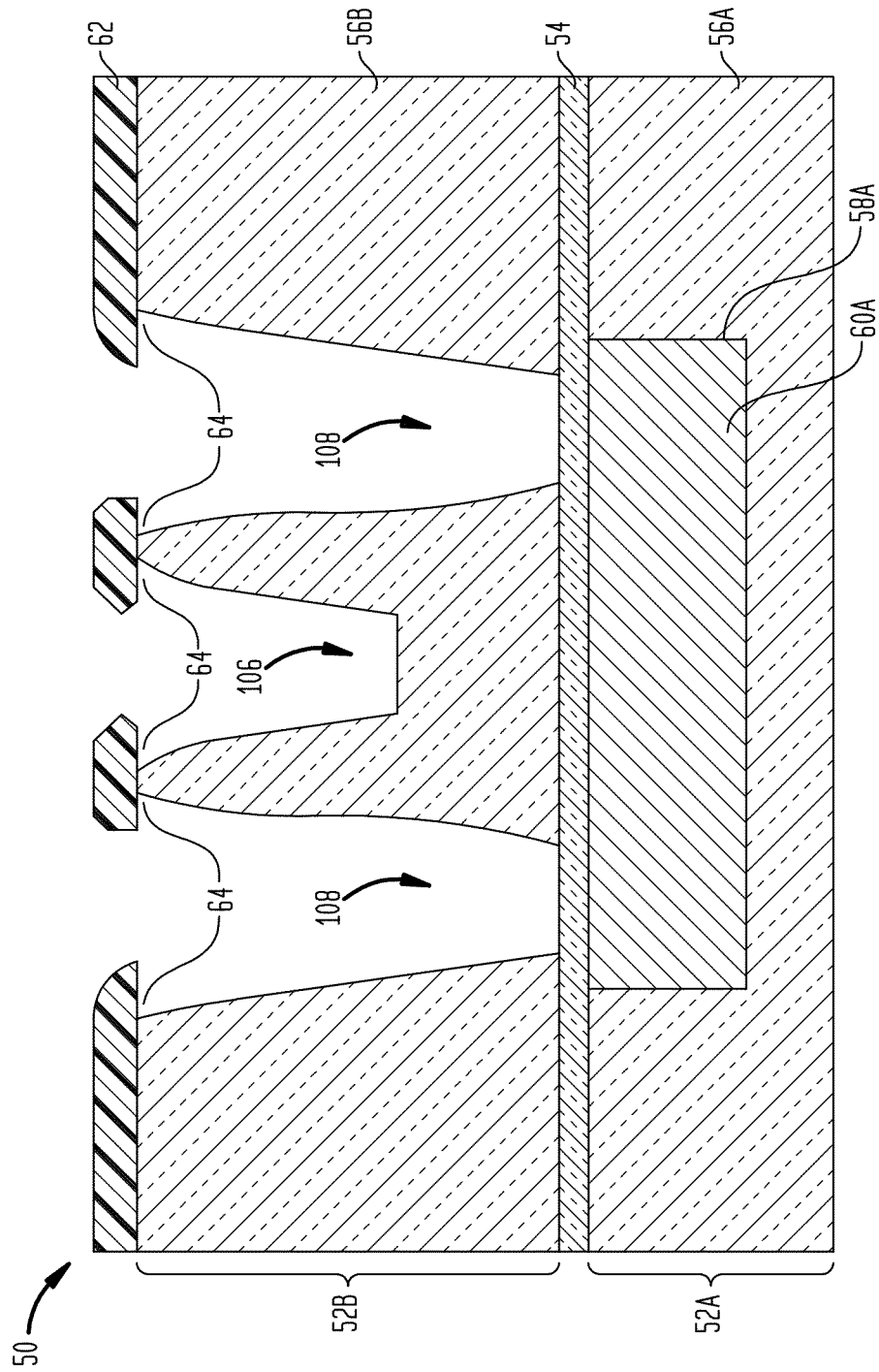
FIGS. 3A-3F are pictorial representations (through cross sectional views) depicting the basic processing steps employed in the present invention for fabricating the inventive interconnect structure shown in FIG. 2A.

In accordance with the present invention, the process flow begins with providing the initial interconnect structure 50 shown in FIG. 3A. Specifically, the initial interconnect structure 50 shown in FIG. 3A comprises a multilevel interconnect including a lower interconnect level 52A and an upper interconnect level 52B that are typically, but not necessarily always, separated by dielectric capping layer 54. The lower interconnect level 52A, which may be located above a semiconductor substrate including one or more semiconductor devices, comprises a first dielectric material 56A having at least one conductive feature (represented by a first conductive material 60A) that is separated from the first dielectric material 56A by a first diffusion barrier 58A. The upper interconnect level 52B comprises a second dielectric material 56B that has at least one opening located therein. FIG. 3A also shows a patterned hard mask 62 located atop the second dielectric material and an undercut region 64 located beneath the patterned hard mask 62.

In FIG. 3A, two openings are shown; reference number 106 denotes a line opening for a single damascene structure, and reference numeral 108 denotes a combined via and a line opening for a dual damascene structure. Although such a structure is shown, the present application is not limited to such a structure. Instead, the present application contemplates structures that include at least one opening to the underlying conductive feature, i.e., the first conductive material 60A. Typically, that at least one opening is a via opening located beneath a line opening.

The initial interconnect structure 50 shown in FIG. 3A is made utilizing standard interconnect processing which is well known in the art. For example, the initial interconnect structure 50 can be formed by first applying the first dielectric material 56A to a surface of a substrate (not shown). The substrate, which is not shown, may comprise a semiconducting material, an insulating material, a conductive material or any combination thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present invention also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or a combination thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

The first dielectric material 56A of the lower interconnect level 52A may comprise any interlevel or intralevel dielectric including inorganic dielectrics or organic dielectrics. The first dielectric material 56A may be porous or non-porous. Some examples of suitable dielectrics that can be used as the first dielectric material 56A include, but are not limited to $SiO_2$, silsesquioxanes, C doped oxides (i.e., organosilicates) that include atoms of Si, C, O and H, SiC(N,H), thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The first dielectric material 56A typically has a dielectric constant that is about 4.0 or less, with a dielectric constant of about 2.8 or less being even more typical. It is noted that the low-k dielectrics (less than 4.0) generally have a lower parasitic crosstalk as compared with dielectric materials that have a higher dielectric constant than 4.0. The thickness of the first dielectric material 56A may vary depending upon the dielectric material used as well as the exact number of dielectrics within the lower interconnect level 52A. Typically, and for normal interconnect structures, the first dielectric material 52A has a thickness from about 200 to about 450 nm.

The lower interconnect level 52A also has at least one conductive feature that is embedded in (i.e., located within) the first dielectric material 56A. The conductive feature comprises a first conductive material 60A, which is separated from the first dielectric material 56A by a first diffusion barrier 58A. The conductive feature is formed by lithography (i.e., applying a photoresist to the surface of the first dielectric material 56A, exposing the photoresist to a desired pattern of radiation, and developing the exposed resist utilizing a conventional resist developer), etching (dry etching or wet etching) an opening in the first dielectric material 56A and filling the etched region with the first diffusion barrier 58A and then with a first conductive material 60A forming the conductive region. The first diffusion barrier 58A, which may comprise Ta, TaN, Ti, TiN, Ru, Ir(Ta), Ir(TaN), Ru(Ta), Ru(TaN), W, WN or any other material that can serve as a barrier to prevent conductive material from diffusing there through, is formed by a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the first diffusion barrier 58A may vary depending on the exact means of the deposition process as well as the material employed. Typically, the first diffusion barrier 58A has a thickness from about 4 to about 40 nm, with a thickness from about 7 to about 20 nm being more typical.

Following the formation of the first diffusion barrier 58A, the remaining region of the opening within the first dielectric material 56A is filled with a first conductive material 60A. The conductive material 60A includes, for example, polySi, a conductive metal, an alloy comprising at least one conductive metal, a conductive metal silicide or combinations thereof. Preferably, the conductive material 60A is a conductive metal such as Cu, W or Al, with Cu or a Cu alloy (such as AlCu) being highly preferred in the present invention. The conductive material 60A is filled into the remaining opening in the first dielectric material 56A utilizing a conventional deposition process including, but not limited to: CVD, PECVD, sputtering, chemical solution deposition or plating. After deposition, a conventional planarization process such as, for example, chemical mechanical polishing (CMP) can be used to provide a structure in which the first diffusion barrier 58A and the conductive material 60A each have an upper surface that is substantially coplanar with the upper surface of the first dielectric material 56A.

It should be noted that the inventive dielectric spacer 66' to be described in greater detail herein below may be formed in the lower interconnect level 52A. If present, the dielectric spacer 66' would line the sidewalls of the at least one opening including first conductive material 60A.

After forming the at least one conductive feature 60A, the dielectric capping layer 54 is formed on the surface of the lower interconnect level 52A utilizing a conventional deposition process such as, for example, CVD, PECVD, chemical solution deposition, or evaporation. It is noted that the dielectric capping layer is not necessarily required in all circumstances. The dielectric capping layer 54 comprises any suitable dielectric capping material such as, for example, SiC, $Si_4NH_3$, $SiO_2$, $Si_3N_4$, a carbon doped oxide, a nitrogen and hydrogen doped silicon carbide SiC(N,H) or multilayers thereof. The thickness of the dielectric capping layer 54 may vary depending on the technique used to form the same as well as the material make-up of the layer. Typically, the dielectric capping layer 54 has a thickness from about 15 to about 55 nm, with a thickness from about 25 to about 45 nm being more typical.

Next, the upper interconnect level 52B is formed by applying the second dielectric material 56B to the upper exposed surface of the dielectric capping layer 54. The second dielectric material 56B may comprise the same or different, preferably the same, dielectric material as that of the first dielectric material 56A of the lower interconnect level 52A. In one embodiment, it is highly preferred to utilize a dielectric material whose dielectric constant is less than 4.0 as the second dielectric material 56B. Porous and non-porous dielectrics, with porous dielectrics being highly preferred, can be used. The processing techniques and thickness ranges for the first dielectric material 56A are also applicable here for the second dielectric material 56B.

A blanket layer of hard mask material such as an oxide-containing material is then formed atop the second dielectric material 56B utilizing a standard deposition process including, for example, chemical vapor deposition, plasma enhanced chemical vapor deposition, chemical solution deposition and atomic layer deposition. Alternatively, the hard mask material can be formed by a thermal process such as, for example, oxidation.

Next, at least one opening is formed into the second dielectric material 56B utilizing lithography, as described above, and etching. The hard mask material is used as a patterned mask during the etching step. The lithographic step includes applying a photoresist atop the hard mask material, exposing the photoresist to a pattern of radiation and developing the exposed resist. After resist development, the pattern is transferred first into the hard mask material (forming patterned hard mask 62) and then into the second dielectric material 56B. The lithographically patterned resist is typically, but not necessarily always, removed after transferring the pattern into the hard mask material. The etching may comprise a dry etching process, a wet chemical etching process or a combination thereof. The term "dry etching" is used herein to denote an etching technique such as reactive-ion etching, ion beam etching, plasma etching or laser ablation.

It should be noted that during the above described etching step and because of the different etching rates between the hard mask material and the second dielectric material 56B, an undercut region 64 forms beneath the patterned hard mask 62.

After providing the initial interconnect structure 50 shown in FIG. 3A, the exposed surfaces of the structure, i.e., the patterned hard mask 62, the exposed sidewalls of the second dielectric material 56B, and the dielectric capping layer 54, are lined with a dielectric liner 66. The resultant structure including dielectric liner 66 is shown, for example, in FIG. 3B.

The dielectric liner 66 is any dense dielectric material including, for example, any of the dielectrics mentioned above for the first and second dielectric materials. The dielectric liner 66 typically, but not necessarily always, has a different composition than the second dielectric material 56B. Example of dielectric materials that can be used as liner 66 include silsesquioxanes, C doped oxides (i.e., organosilicates) that include atoms of Si, C, O and H, thermosetting polyarylene ethers, $SiO_2$, $Si_3N_4$, SiC(N,H), SiC or multilayers thereof.

The dielectric liner 66 is formed utilizing any deposition process including, for example, chemical vapor deposition and plasma enhanced chemical vapor deposition. The thickness of the dielectric liner 66 that is deposited is typically from about 100 to about 2000 Å, with a thickness from about 300 to about 800 Å being even more typical.

It is noted that under normal deposition conditions, an air gap 68 remains in the structure after deposition of the dielectric liner 66. The presence of the air gap 68 is advantageous since it lowers the overall capacitance of the interconnect structure. As shown, the air gap 68 is located beneath the patterned hard mask 62 and between the liner 66 and the patterned second dielectric material 56B.

Figure 3B:
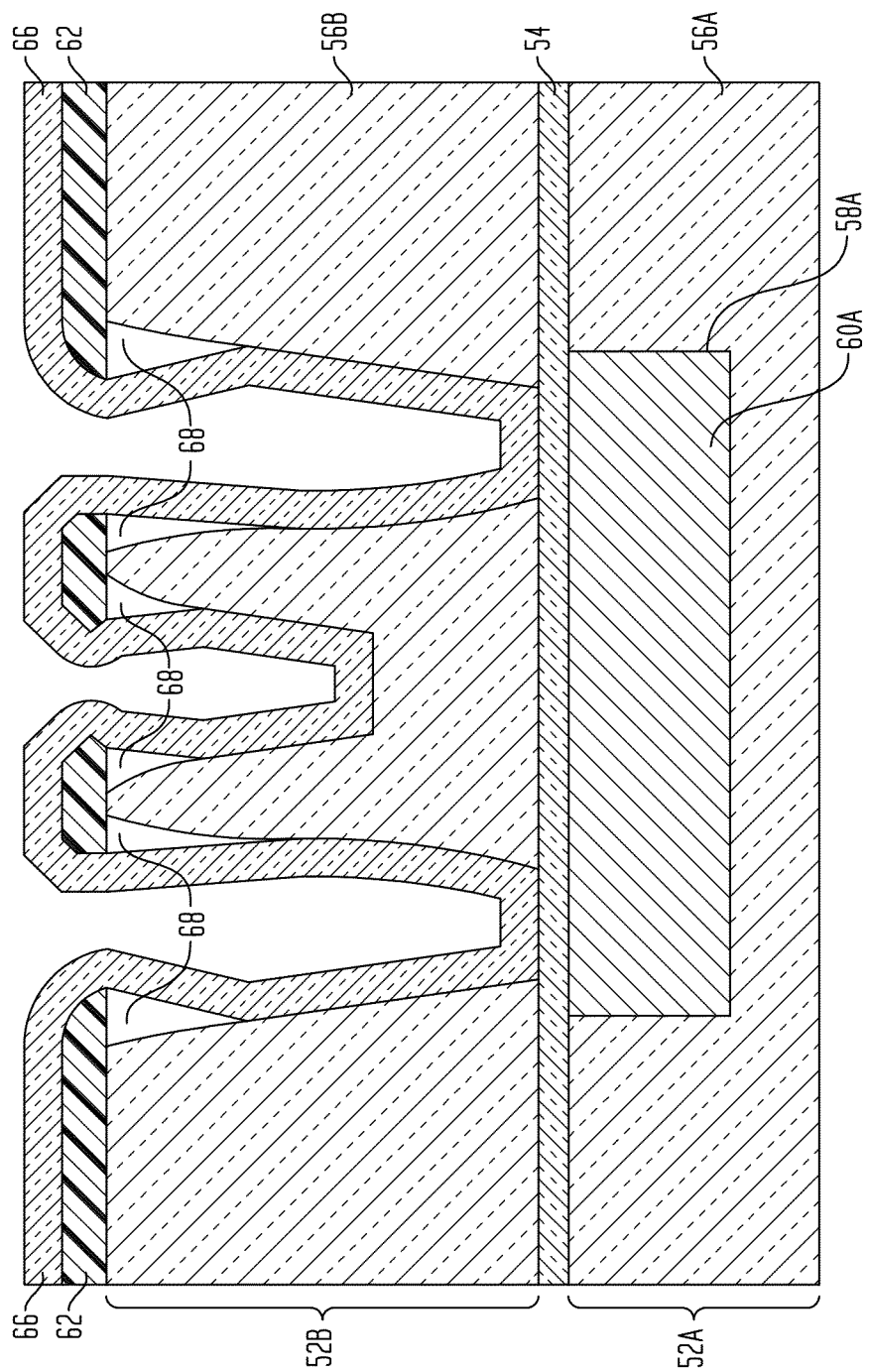
Figure 3C:
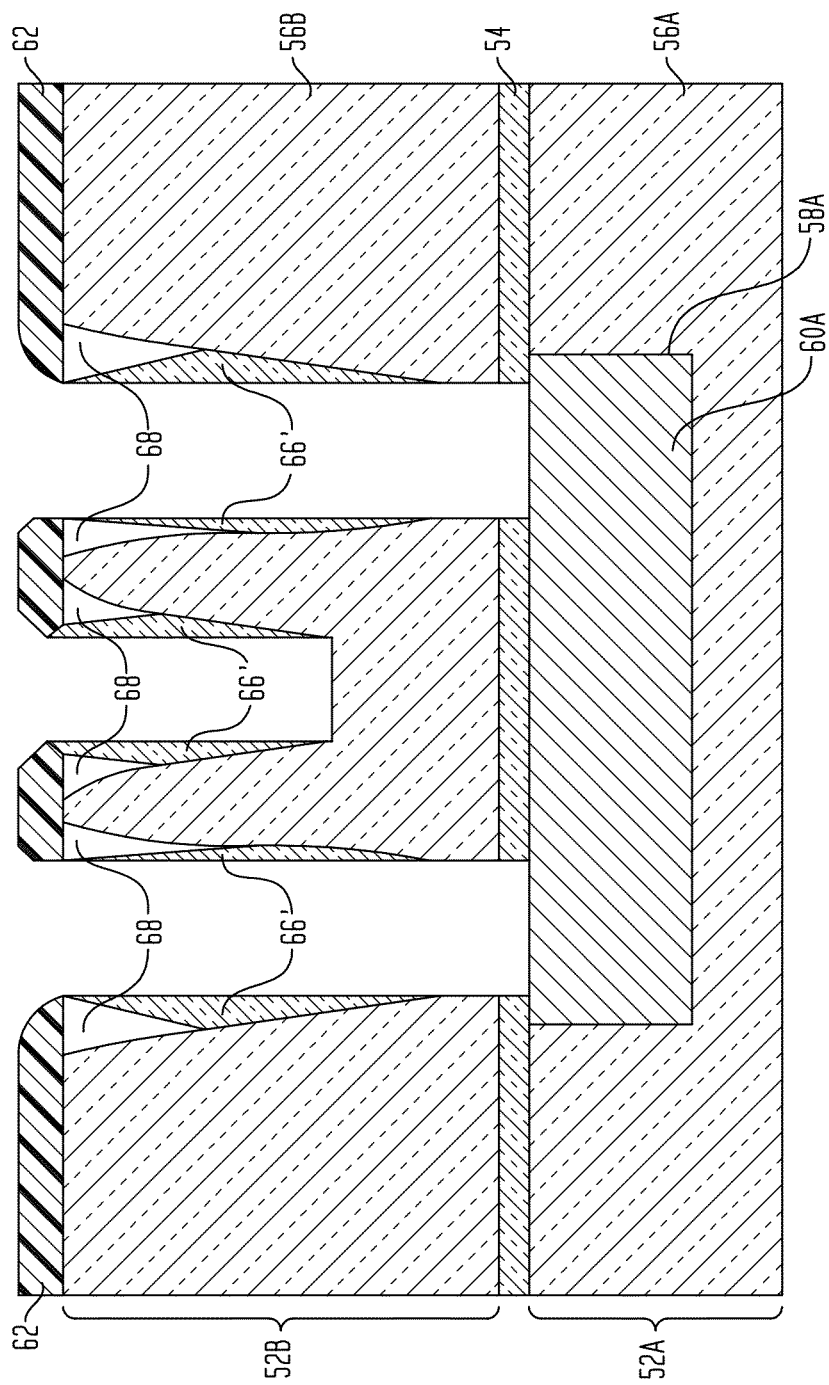
Figure 3D:
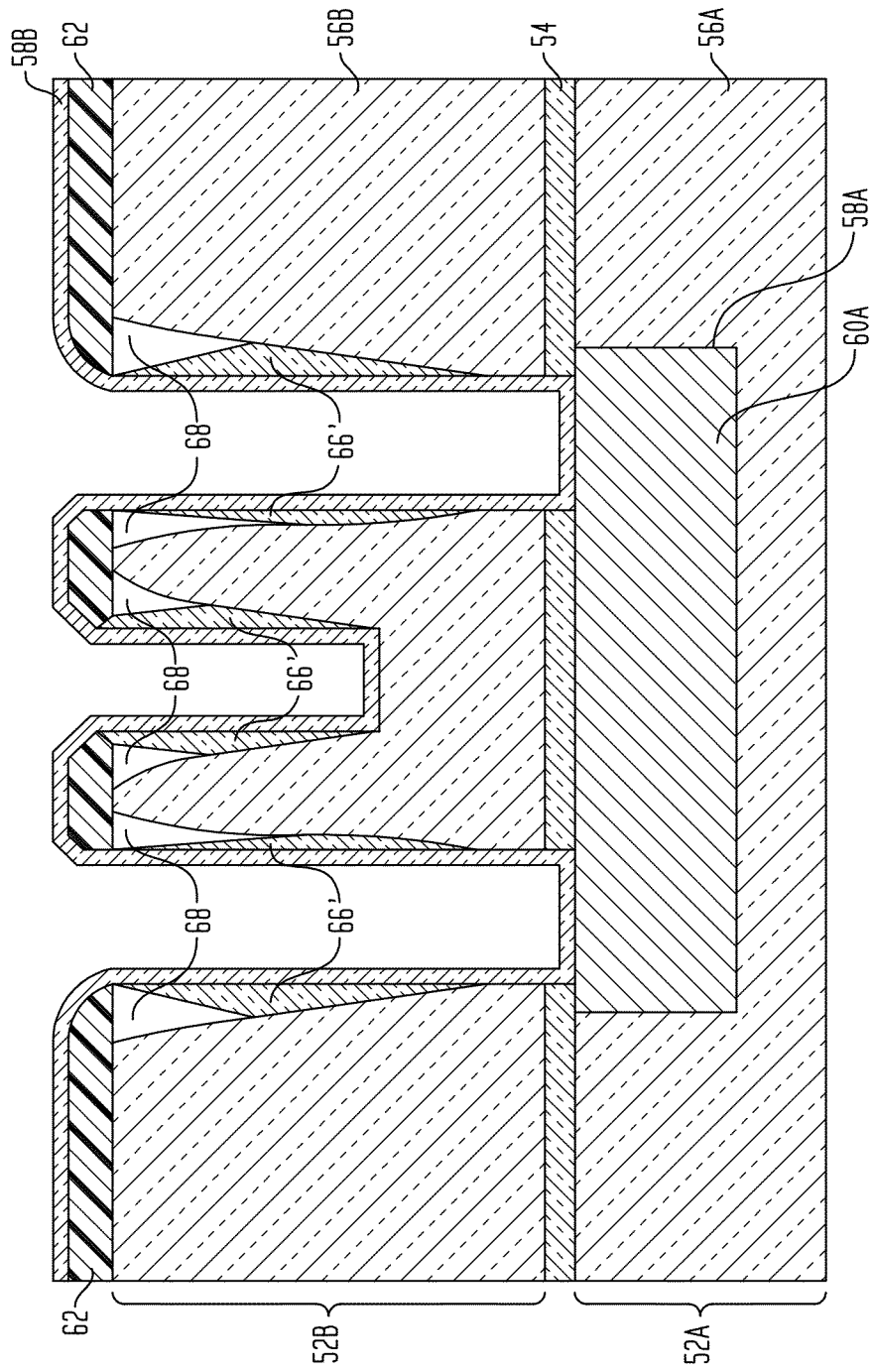

The dielectric liner 66 shown in FIG. 3B is then subjected to an anisotropic etching process which provides a dielectric spacer 66' (see, for example, FIG. 3C) which is present on the exposed sidewall portions of the patterned second dielectric material 56B; the anisotropic etching removes the dielectric material that is present on all horizontal surfaces within the structure. The resultant structure including dielectric spacer 66' is shown, for example, in FIG. 3C.

It is emphasized that during the above mentioned anisotropic etch, a portion of the dielectric capping layer 54 is typically removed. If the etching used in forming the dielectric spacer 66' does not remove the underlying dielectric capping layer 54, a separate etching process can be used to selectively remove the exposed portion of the dielectric capping layer 54.

Next, a second diffusion barrier 58B is provided by forming the second diffusion barrier 58B on exposed surfaces including the previously formed dielectric spacer 66'. The resultant structure is shown, for example, in FIG. 3D. The second diffusion barrier 58B comprises at least one of TaN, Ta, TiN, TiN, Ir(Ta), Ir(TaN), Ru(Ta), Ru(TaN), W and WN. The second diffusion barrier 58B is formed utilizing a deposition process such as, for example, atomic layer deposition (ALD), chemical vapor deposition (CVD), plasma enhanced chemical vapor deposition (PECVD), physical vapor deposition (PVD), sputtering, chemical solution deposition, or plating.

The thickness of the second diffusion barrier 58B may vary depending on the number of material layers, the technique used in forming the same as well as the material of the second diffusion barrier 58B itself. Typically, the second diffusion barrier 58B has a thickness from about 4 to about 40 nm, with a thickness from about 7 to about 20 nm being even more typical.

It is noted that the presence of the dense dielectric spacer 66' aids in providing a second diffusion barrier 58B that is continuous.

At this point of the present invention, an optional plating seed layer (not shown) can be formed at least within the openings atop the second diffusion barrier 58B. Although optional, it is preferred to include a plating seed layer within the structure to aid in growth of the conductive material. This is especially the case when a conductive metal or metal alloy is to be subsequently formed within the at least one opening. When present, the plating seed layer may comprise a conductive metal or metal alloy such as that used in forming the conductive material to be described in greater detail herein below. Typically, and when the conductive material comprises Cu, the plating seed layer comprises Cu, CuAl, CuIr, CuTa, CuRh, Ru, Ir, CuRu, or other alloys of Cu, i.e., Cu-containing alloys.

The plating seed layer is formed by a conventional deposition process including, for example, ALD, CVD, PECVD, PVD, chemical solution deposition and other like deposition processes. The thickness of the plating seed layer may vary and it is within ranges that are well known to those skilled in the art. Typically, the plating seed layer has a thickness from about 2 to about 80 nm.

Figure 3E:
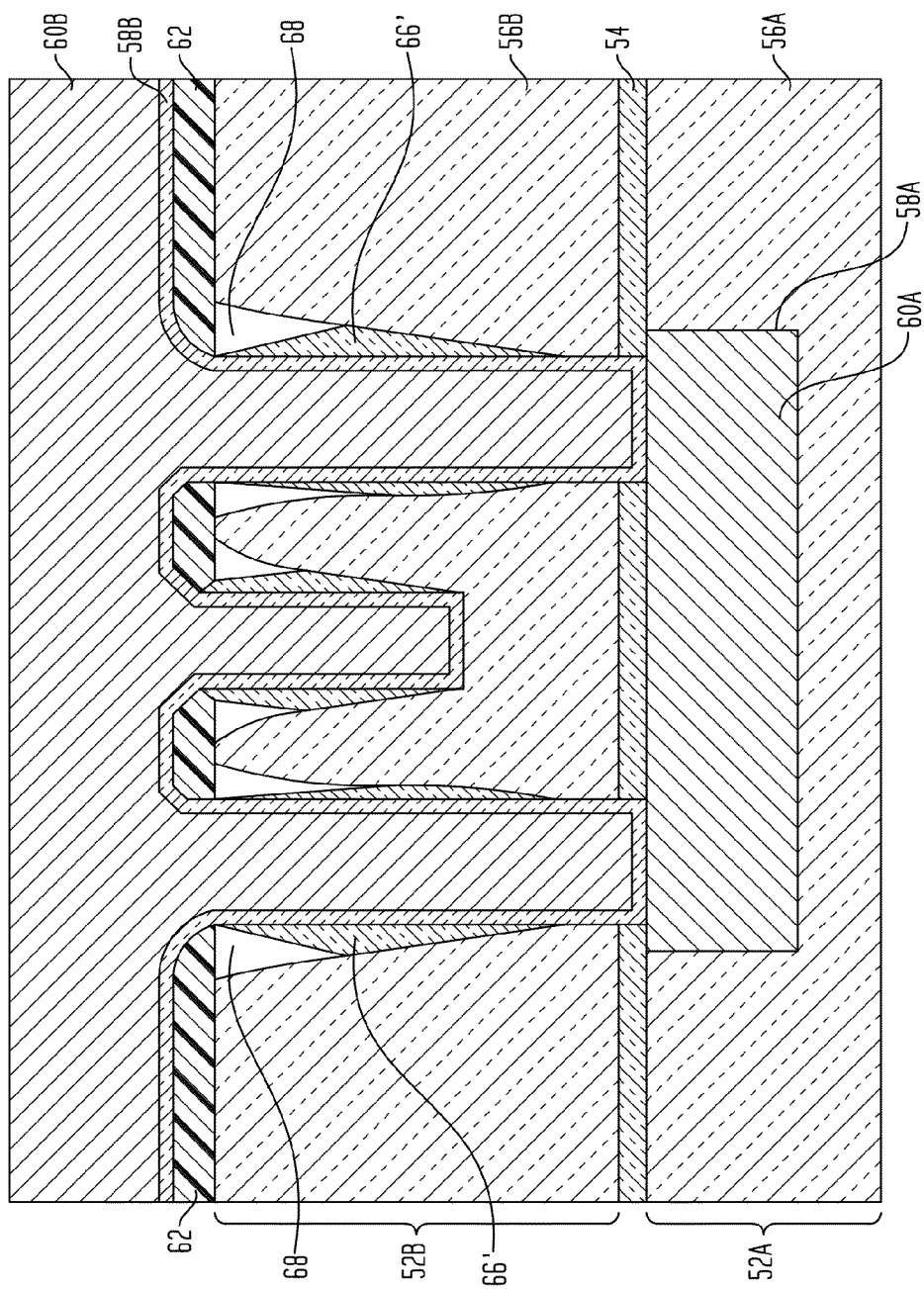
Figure 3F:
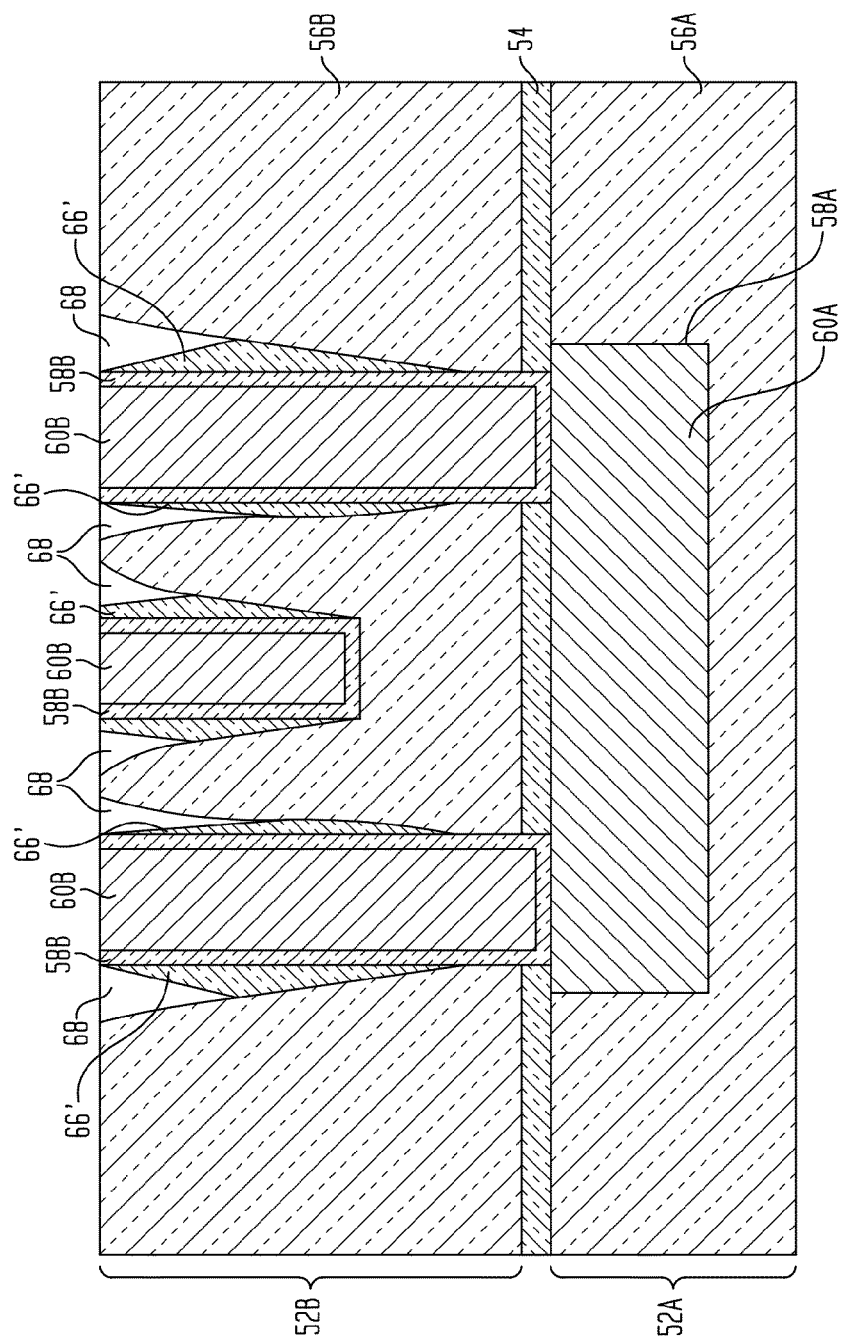

Next, a second conductive material 60B which is the same or different from that of the first conductive material 60A is formed within the at least one opening. The second conductive material 60B forms a second conductive feature within the structure. Preferably, Cu, Al, W or alloys thereof are used, with Cu or AlCu being most preferred. The second conductive material 60B is formed utilizing the same deposition processing as described above in forming the first conductive material 60A and following deposition of the second conductive material 60B, the structure is subjected to planarization. FIG. 3E shows the interconnect structure after conductive material 60B deposition, while FIG. 3F shows the interconnect structure after planarization. The planarization process, which includes grinding and/or chemical mechanical polishing (CMP) removes the patterned hard mask 62 from the structure.

Following the planarization process, a second dielectric capping layer 54B can be formed as described above providing the structure illustrated in FIG. 2A.

It is again noted that the same basic processing steps as described above can be used in forming the structure shown, in FIG. 2B except that a better conformal deposition of the dielectric liner 66 is performed such that no air gap is present in the structure. An alternative method to create more volume of air gap 68 is to exaggerate the undercut feature 24 intentionally post/during the etching process.

It is noted that the embodiment depicted above is for a closed via-bottom structure. In another embodiment of the present invention, an open-via bottom structure can be provided. In the open-via bottom structure, the second conductive material 60B is in direct contact with a surface of the first conductive material 60A. The open-via bottom structure is formed by removing the second diffusion barrier from the bottom of via utilizing ion bombardment or another like directional etching process. The present invention also contemplates an anchored-via bottom structure. The anchored-via bottom structure is formed by first etching a recess into the conductive feature in the first dielectric material 56A utilizing a selective etching process. After formation of the second diffusion barrier, the second diffusion barrier is typically removed from the bottom portion of the via and recess by a directional etching process. The second conductive material is then formed as described above.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An interconnect structure comprising:
   a dielectric material of unitary composition and having at least one opening therein;
   a dense dielectric spacer having a taper and located partially within the at least one opening and in direct contact with a first sidewall portion of the dielectric material of unitary composition;
   a diffusion barrier located within the at least one opening, wherein a first surface of the diffusion barrier directly contacts a surface of the dense dielectric spacer and wherein a second surface of the diffusion barrier directly contacts a second sidewall portion of the dielectric material of unitary composition; and
   a conductive material located on said diffusion barrier.

2. The interconnect structure of claim 1 wherein said dielectric material of unitary composition has a dielectric constant of about 4.0 or less.

3. The interconnect structure of claim 2 wherein said dielectric material of unitary composition is one of $SiO_2$, a silsesquioxane, a C doped oxide that include atoms of Si, C, O and H, SiC(N,H) and a thermosetting polyarylene ether.

4. The interconnect structure of claim 2 wherein said dielectric material of unitary composition is porous.

5. The interconnect structure of claim 1 wherein said dense dielectric spacer is comprised of $SiO_2$, $Si_3N_4$, SiC, a silsesquioxane, a C doped oxide that include atoms of Si, C, O and H, SiC(N,H), a thermosetting polyarylene ether or multilayers thereof.

6. The interconnect structure of claim 1 wherein said dense dielectric spacer has a composition that differs from said dielectric material of unitary composition.

7. The interconnect structure of claim 1 wherein said conductive material comprises polySi, a conductive metal, an alloy comprising at least one conductive metal, a conductive metal silicide or combinations thereof.

8. The interconnect structure of claim 1 wherein said conductive material is Cu, W, Al or a Cu alloy.

9. The interconnect structure of claim 1 wherein said diffusion barrier comprises Ta, TaN, Ti, TiN, Ru, Ir(Ta), Ir(TaN), Ru(Ta), Ru(TaN), W or WN.

10. The interconnect structure of claim 1 further comprising a dielectric capping layer located on an uppermost surfaces of the dielectric material of unitary composition, said conductive material, said dense dielectric spacer and said diffusion barrier.

11. The interconnect structure of claim 10 further comprising an air gap located beneath the dielectric capping layer and between an upper portion of the dense dielectric spacer and said dielectric material of unitary composition.

12. The interconnect structure of claim 1 wherein said dense dielectric spacer has a composition that differs from said dielectric material of unitary composition, and is composed of SiC.

13. The interconnect structure of claim 1 wherein said dense dielectric spacer has a composition that differs from said dielectric material of unitary composition, and is composed of a silsesquioxane.

14. The interconnect structure of claim 1 wherein said dense dielectric spacer has a composition that differs from said dielectric material of unitary composition, and is composed of a C doped oxide.

15. The interconnect structure of claim 1 wherein said dense dielectric spacer has a composition that differs from said dielectric material of unitary composition, and is composed of SiC(N,H).

16. The interconnect structure of claim 1 wherein said dense dielectric spacer has a top portion, a middle portion and a bottom portion, wherein said middle portion of said dense dielectric spacer has a width that is greater than a width at either the top or bottom portion of the dense dielectric spacer.

17. The interconnect structure of claim 1 further comprising another dielectric material located beneath said dielectric material of unitary composition, wherein said another dielectric material has another conductive material embedded therein, and wherein an topmost surface of the another conductive material is coplanar with a topmost surface of the another dielectric material.

18. The interconnect structure of claim 17 wherein no portion of the dense dielectric spacer is in direct physical contact with said another dielectric material.

19. The interconnect structure of claim 18 wherein a bottommost surface of one portion of the diffusion barrier is in direct physical contact with said topmost surface of the another conductive material.

* * * * *